United States Patent
Granik et al.

(10) Patent No.: US 6,643,616 B1
(45) Date of Patent: Nov. 4, 2003

(54) INTEGRATED DEVICE STRUCTURE PREDICTION BASED ON MODEL CURVATURE

(76) Inventors: Yuri Granik, 38838 Litchfield Cir., Fremont, CA (US) 94535; Nicolas Bailey Cobb, 1632 Willow Lake La., San Jose, CA (US) 95131-3553; Franklin Mark Schellenberg, 4023 Villa Vista, Palo Alto, CA (US) 94305

( * ) Notice: Subject to any disclaimer, the term of this patent is extended or adjusted under 35 U.S.C. 154(b) by 0 days.

(21) Appl. No.: 09/457,410

(22) Filed: Dec. 7, 1999

(51) Int. Cl.[7] .......................... G06F 17/50; G06F 17/10; G06F 7/60; G06G 7/62
(52) U.S. Cl. ............................... 703/13; 703/1; 703/2; 716/19; 716/21
(58) Field of Search ...................... 703/1, 2, 13; 716/19, 716/21

(56) References Cited

U.S. PATENT DOCUMENTS

| | | | |
|---|---|---|---|
| 5,815,685 A | | 9/1998 | Kamon .......................... 716/21 |
| 5,825,647 A | * | 10/1998 | Tsudaka ....................... 700/57 |
| 6,033,814 A | * | 3/2000 | Burdorf et al. .............. 430/296 |
| 6,080,527 A | * | 6/2000 | Huang et al. ................ 430/296 |
| 6,120,952 A | | 9/2000 | Pierrat et al. .................. 430/30 |
| 6,226,781 B1 | * | 5/2001 | Nistler et al. .................. 716/19 |
| 6,249,904 B1 | * | 6/2001 | Cobb ........................... 716/21 |
| 6,269,472 B1 | * | 7/2001 | Garza et al. ................... 716/21 |
| 6,301,697 B1 | * | 10/2001 | Cobb ............................. 703/1 |
| 6,312,854 B1 | * | 11/2001 | Chen et al. ..................... 430/5 |
| 6,370,679 B1 | * | 4/2002 | Chang et al. .................. 430/30 |

OTHER PUBLICATIONS

Washington, Allyn. Basic Technical Mathematics with Calculus, Second Edition. 1970. pp. 245–247,260–262,505–525.*

Schellenberg, F.M. "Design for Manufacturing in the Semiconductor Industry: The Litho / Design Workshops", Proceeding, 12th Int'l Conference on VLSI Design, 1999. Jan. 7–10, 1999.*

Schellenberg, Frank M. "Sub–Wavelength Lithography Using OPC", Semiconductor Fabtech, Edition 9, Mar. 1999.*

SPIE Proceedings vol. 3873. 19th Annual Symposium on Photomask Technology, Editors: Abboud, Frank et al. Published 1999. p. 21.*

SPIE Proceedings vol. 2726. Optical Microlithography IX, Editors: Fuller, Gene et al. Published 1996. p. 15.*

Benchmark Technologies, OPC Reference Standard (J111A) Reticle. Oct. 12, 1999.*

Mentor Graphics Intrenet Site, Technical Papers, "Resolution Enhancement Technologies (OPC/PSM)". Jul. 16, 2002.*

(List continued on next page.)

*Primary Examiner*—Samuel Broda
*Assistant Examiner*—Ayal I. Sharon
(74) *Attorney, Agent, or Firm*—Christensen O'Connor Johnson Kindness PLLC

(57) ABSTRACT

Methods and apparatuses for structure prediction based on model curvature are described. A simulation result corresponding to an integrated circuit or other structure is generated. The result includes contour data representing a feature value, for example, height (or intensity) of the structure at various points. Three or more points are used to determine a curvature of the result at a predetermined location. The curvature information can be used to determine boundaries of the structure. For example, when used with an integrated circuit layout, the curvature can be used for optical and process correction (OPC) purposes to modify an integrated circuit layout such that the resulting integrated circuit more closely resembles the designed integrated circuit than would otherwise be possible. In one embodiment, both slope and curvature of the integrated circuit structure are used for OPC purposes.

6 Claims, 7 Drawing Sheets

OTHER PUBLICATIONS

Rieger et al. "Using Behavior Modeling for Proximity Correction". Proc. SPIE vol. 2197, Optical/Laser Microlithography VII, pp. 371–376. May 1994.*

Stirniman et al. "Optimizing Proximity Correction for Wafer Fabrication Processes". Proc. SPIE vol. 2322, $14^{th}$ Annual Bacus Symposium on Photomask Technology and Management. pp. 239–246. Dec. 1994.*

"Fast Optical and Proscess Proximity Correction Algorithms for Integrated Circuit Manufacturing,"Nicolas Bailey Cobb, PhD Dissertation, University of California at Berkeley, pp. 64–71, Spring 1988.

"Lithography Simulation with Aerial Image—Variable Threshold Resist Model" John Randall et al., International Conference on Mirco and Nano Engineering vol. 46, pp. 59–60, Sep. 1998.

"Mathematical and CAD Framework for Proximity Correction" Nick Cobb et al., Optical Microlithography IX, SPIE– The International Society for Optical Engineering vol. 2726, pp. 208–222, Mar. 1996.

"Experimental Results on Optical Proximity Correction with Variable Threshold Resist Model" Nick Cobb et al., Optical Microlithography X, SPIE– The International Society for Optical Engineering vol. 3051, pp. 458–468, Mar. 1997.

Schellenberg, et al., "SEMATECH J111 Project: OPC Validation," Proc. SPIE Optical Microlithography XI, Luc Van den Hove, ed., vol. 3334, 1998, pp. 892–911.

Spence, et al., "Integration of Optical Proximity Correction Strategies in Strong Phase Shifers Design for Poly–Gate Layers," Paper No. 3873–273 in Proc. SPIE 19th Annual Symposium of Photomask Technology, Gene E. Fuller, ed., vol. 3873, 1999, pp., 277–287.

* cited by examiner

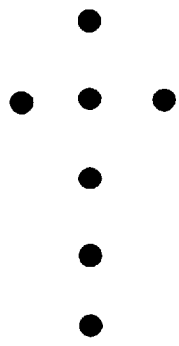
FIG. 4a
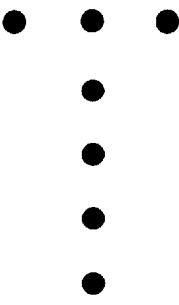
FIG. 4b
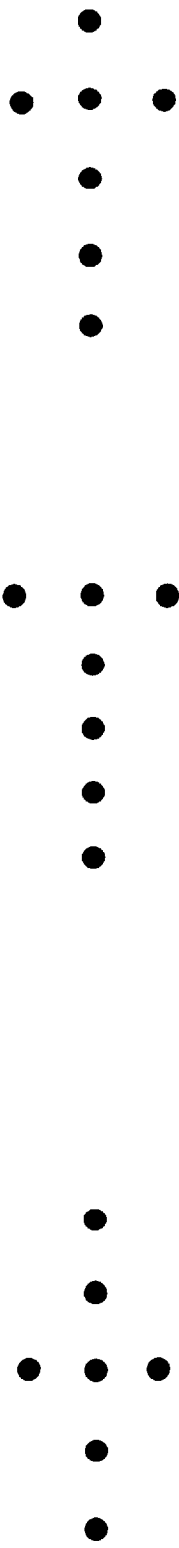
FIG. 4c
FIG. 4d
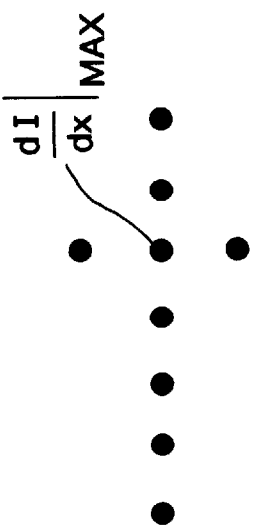
FIG. 4e
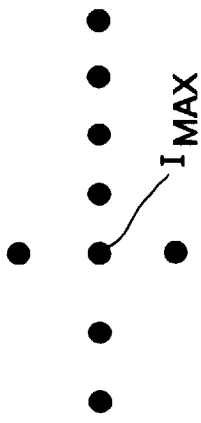
FIG. 4f
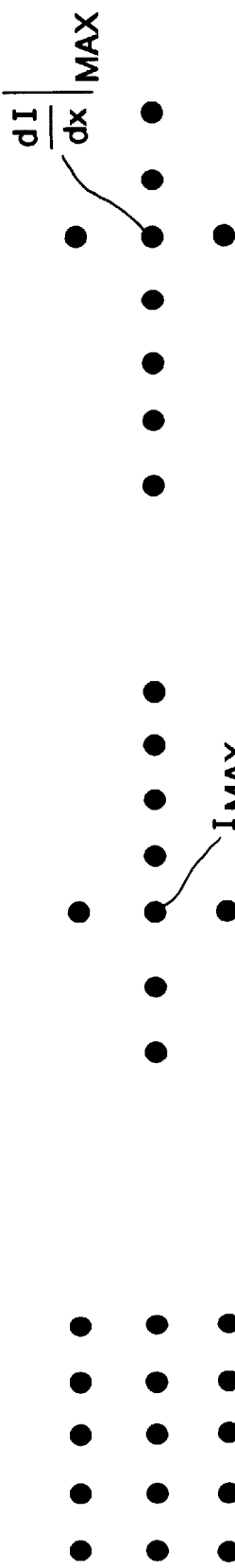

INTEGRATED DEVICE STRUCTURE PREDICTION BASED ON MODEL CURVATURE

FIELD OF THE INVENTION

The invention relates to structure modeling and prediction. More specifically, the invention relates to predicting a physical structure, for example, integrated circuit structures, based on information derived from contour representations.

BACKGROUND OF THE INVENTION

As integrated circuits (ICs) become more dense, the widths of lines and components, as well as the separation between lines becomes increasingly smaller. Currently, deep sub-micron (<0.25 $\mu$m) processes are being used. However, with deep sub-micron processes, silicon yield is affected by several factors including reticle/mask pattern fidelity, optical proximity effects, and diffusion and loading effects during resist and etch processing. Typical problems include linewidth variations that depend on local pattern density and topology and line end pullback.

Optical and process correction (OPC) can be used to improve image fidelity. Optical proximity correction is a subset of optical and process correction. OPC techniques include, for example, introduction of additional structures to the IC layout that compensate for various process distortions. Two general categories of OPC are currently in use: rule-based OPC and model-based OPC. In rule-based OPC, a reticle layout is modified according to a set of fixed rules for geometric manipulation. However, rule-based OPC has limited capability and when more complex OPC is desired, model-based OPC is used.

In model-based OPC, an IC structure to be formed is modeled and a threshold that represents the boundary of the structure on the wafer can be determined from simulated result generated based on the model used. Simple forms of model-based OPC generate a simulated aerial image, I(x, y), having a threshold, $I_{th}$, to predict the structure to be manufactured.

A more sophisticated and accurate model-based OPC technique, referred to as the Variable Threshold Resist (VTR) model, allows the threshold, $I_{th}$, to take on multiple values. The VTR model is described by Cobb, et al., "Mathematical and CAD Framework for Proximity Correction," Optical Microlithography IX, Proc. SPIE 2726, pp. 208–222 (1996); Cobb, et al., "Experimental Results in Optical Proximity Correction with Variable Threshold Resist Model," Optical Microlithography X, SPIE 3051, pp. 458–468 (1998); and Nicholas B. Cobb, "Fast Optical and Process Proximity Correction Algorithms for Integrated Circuit Manufacturing," PhD dissertation, Univ. Cal. Berkeley (1998).

FIG. 1 is one embodiment of contours representing an integrated circuit line end based on a Variable Threshold Resist (VTR) model. In general, the VTR model is used to determine characteristics of the integrated circuit structure where the threshold, $$I_{th} = f\left(I_{max}, \left.\frac{\partial I}{\partial x}\right|_{max}\right),$$

is a function of two variables, maximum intensity, $I_{max}$, and maximum slope, $$\left.\frac{\partial I}{\partial x}\right|_{max},$$

as measured along a one-dimensional cut-line through the x-axis of the simulated result. As illustrated in FIG. 1, the x-axis orientation is parallel to one of the axes used in the integrated circuit layout. The slope determined from the simulated result can be used to modify the design of the integrated circuit.

The VTR model has been used to provide improved IC manufacturing; however, for certain situations, for example, line-end shortening, rule-based OPC can still provide better correction. Therefore, it is desirable to have an improved model-based OPC model.

SUMMARY OF THE INVENTION

Methods and apparatuses for structure prediction based on model curvature are described. A predicted curvature for a structure to be realized is determined. The structure can be, for example, an integrated circuit structure on a layer of an integrated circuit. The predicted curvature is used to determine a predicted boundary of the structure. Based on the predicted boundary of the integrated circuit structure to be realized, the layout of the integrated circuit structure can be modified.

BRIEF DESCRIPTION OF THE DRAWINGS

The invention is illustrated by way of example, and not by way of limitation in the figures of the accompanying drawings in which like reference numerals refer to similar elements.

FIGS. 4A–4F illustrate exemplary sampling patterns suitable for use with the invention.

DETAILED DESCRIPTION

Figure 1:
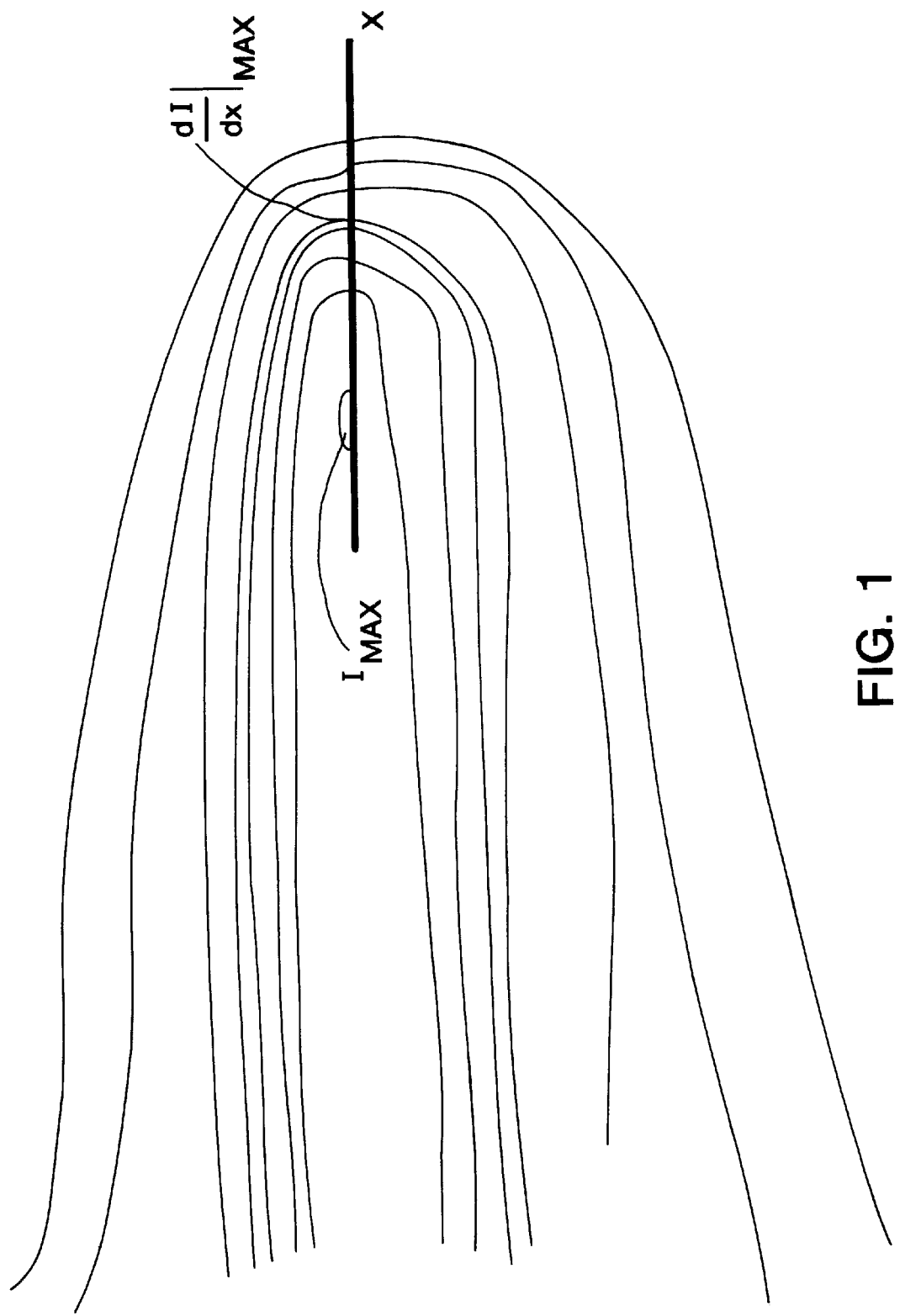
FIG. 1 is one embodiment of contours representing an integrated circuit line end based on a Variable Threshold Resist (VTR) model.

Methods and apparatuses for structure prediction based on model curvature are described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art.

An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention also relates to apparatuses for performing the operations herein. These apparatuses may be specially constructed for the required purposes, or may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

Briefly, a simulation result corresponding to an integrated circuit or other structure is generated. The result includes contour data representing a feature value, for example, height (or intensity) of the structure at various points. Three or more points are used to determine a curvature of the result at a predetermined location. The curvature information can be used to determine boundaries of the structure. For example, when used with an integrated circuit layout, the curvature can be used for optical and process correction (OPC) purposes to modify an integrated circuit layout such that the resulting integrated circuit more closely resembles the designed integrated circuit than would otherwise be possible. In one embodiment, both slope and curvature of the integrated circuit structure are used for OPC purposes.

Figure 2:
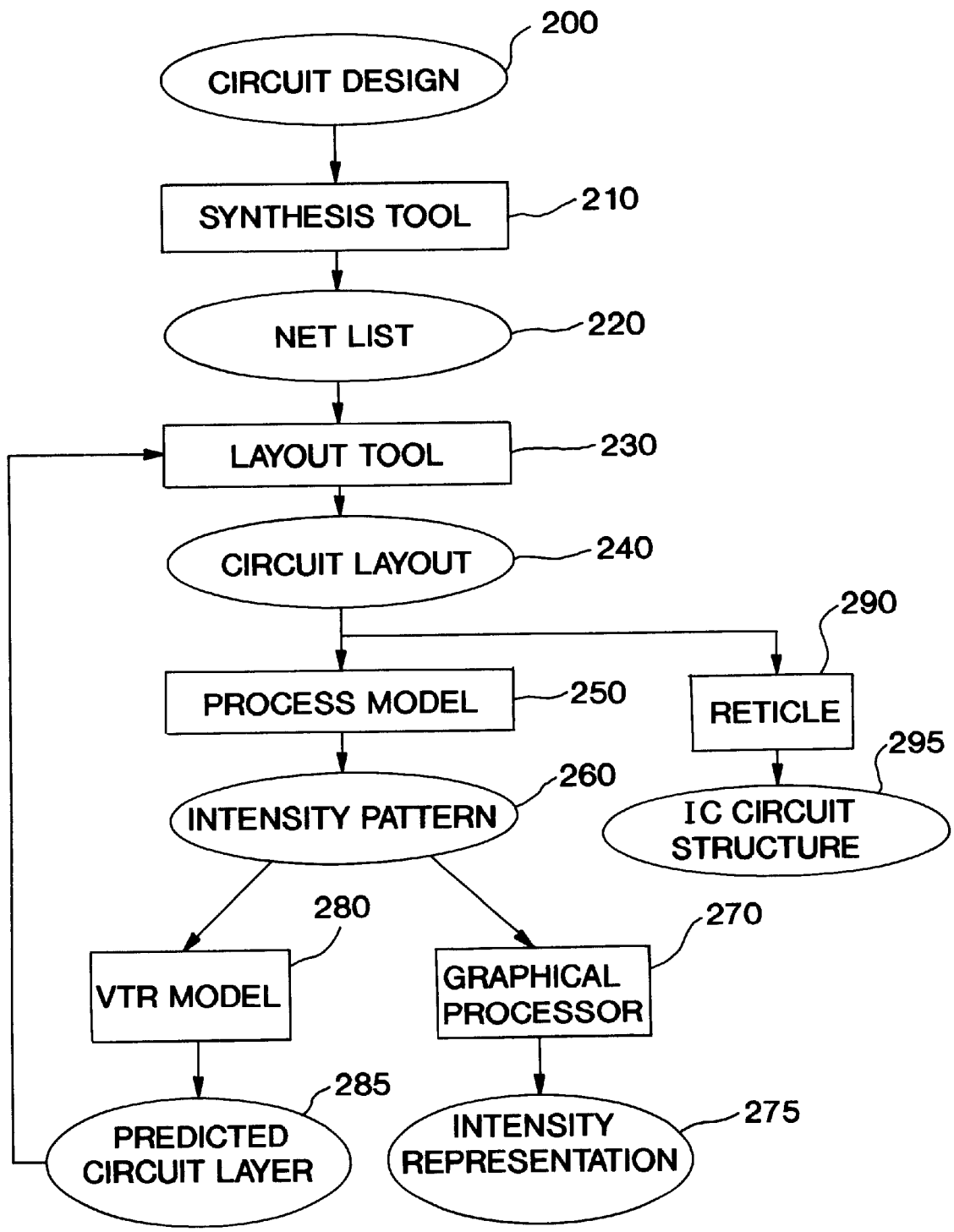
FIG. 2 represents one embodiment of an integrated circuit layer prediction process suitable for use with the invention.

FIG. 2 represents one embodiment of an integrated circuit layer prediction process suitable for use with the invention. In general, the process described with respect to FIG. 2 generates a predicted circuit layer from a circuit design. The predicted circuit layer can be used for OPC purposes. The process can be used for multiple layers of an integrated circuit design.

Circuit design 200 represents a circuit described in functional, rather than, physical terms. In one embodiment, circuit design 200 is a high-level integrated circuit (IC) description languages such as VHDL and Verilog®, which are commonly used to design circuits. One embodiment of VHDL is described in greater detail in "IEEE Standard VHDL Language Reference Manual," ANSI Std. 1076–1993, Published Jun. 6, 1994. One embodiment of Verilog® is described in greater detail in IEEEE Standard 1364–1995. These and other high-level IC description languages allow a circuit designer to design and simulate circuits by using high-level code to describe the structure and/or behavior of the circuit being designed.

Circuit design 200 is typically input to a synthesis tool 210, which generates netlist 220. Other software tools can also be used to create netlists using customized design techniques. Netlist 220 describes the logical relationship of circuit elements to provide the desired functionality. Netlist 220 can then be used to develop the layout that will be used to fabricate an IC having the desired functionality. Netlist 220 can also be used for verification purposes.

Netlist 220 is input to layout tool 230, which can be an electronic design automation (EDA) tool, one embodiment of which is described in greater detail below, or any other tool that generates a circuit layout based on circuit design 200. Circuit layout 240 is generated by layout tool 230. Circuit layout 240 has multiple layers, determined based on circuit design 200 and the manufacturing process to be used, and can be represented in any appropriate format for describing a layout for circuit design 200.

Process model 250 receives circuit layout 240 and generates intensity pattern 260. In one embodiment process model 250 is a mathematical model that is based on the manufacturing process to be used to manufacture an integrated circuit based on circuit design 200. The mathematical model can be performed by, for example, a computer system having a processor that executes a sequence of instructions stored in memory that represent the mathematical model. Process models are known in the art and examples of process models and/or references to process models can be found in the papers cited above in the Background of the Invention.

Process model 250 generates intensity pattern 260 for a layer of the integrated circuit, which represents the intensity of light to which the physical integrated circuit will be exposed based on information related to the manufacturing process to be used. The intensity determines the exposure, and therefore, the size and shape of the integrated circuit structure. In one embodiment, intensity pattern 260 is a mathematical representation of the integrated circuit structure stored, for example, in a machine-readable storage medium.

Graphical processor 270 operates on intensity pattern 260 to generate intensity representation 275. Graphical processor 270 and intensity representation 275 are not necessary to practice the invention; however, intensity representation 275 can be useful in circuit design and OPC. Intensity representation 275 is any physical representation of intensity pattern 260, for example, a display on a computer screen, a printed contour plot, etc. In one embodiment, intensity representation 275 illustrates the integrated circuit layer with contour lines that represent constant intensity, or constant elevation. Graphical processor 270 is any device (e.g., a computer system with a display device and/or printer) that converts intensity pattern 260 to intensity representation 275.

VTR model 280 also operates on intensity pattern 260 to generate predicted realization of the circuit layer 285. One embodiment of VTR model 280 is described in greater detail below. In one embodiment, predicted realization of the circuit layer 285 provides a threshold line, $I_{th}$, that represents a predicted boundary of the integrated circuit structure(s) on the layer processed.

In one embodiment, the threshold line, $I_{th}$, is determined taking into consideration curvature information determined as described below with respect to FIG. 3. In one embodiment, predicted realization of the circuit layer 285 also includes curvature information as discussed below.

Predicted realization of the circuit layer 285 is used to modify circuit layout 240. For example, if predicted realization of the circuit layer 285 indicates that the circuit layer will not provide an appropriate structure (e.g., line end shortening), circuit layout 240 can be modified (e.g., extend the line end) to compensate for the deficiency. Thus, predicted realization of the circuit structure 285 can be used as feedback to provide OPC for the integrated circuit design. The layout modification and modeling process can be repeated as necessary until predicted realization of the circuit structure 285 indicates a satisfactory design.

Once a satisfactory design is achieved, the corresponding circuit layout 240 is used to generate reticle 290. Reticle 290 can be generated in any manner known in the art. Reticle 290 is used in an integrated circuit manufacturing process to manufacture integrated circuit structure 295.

Figure 3:
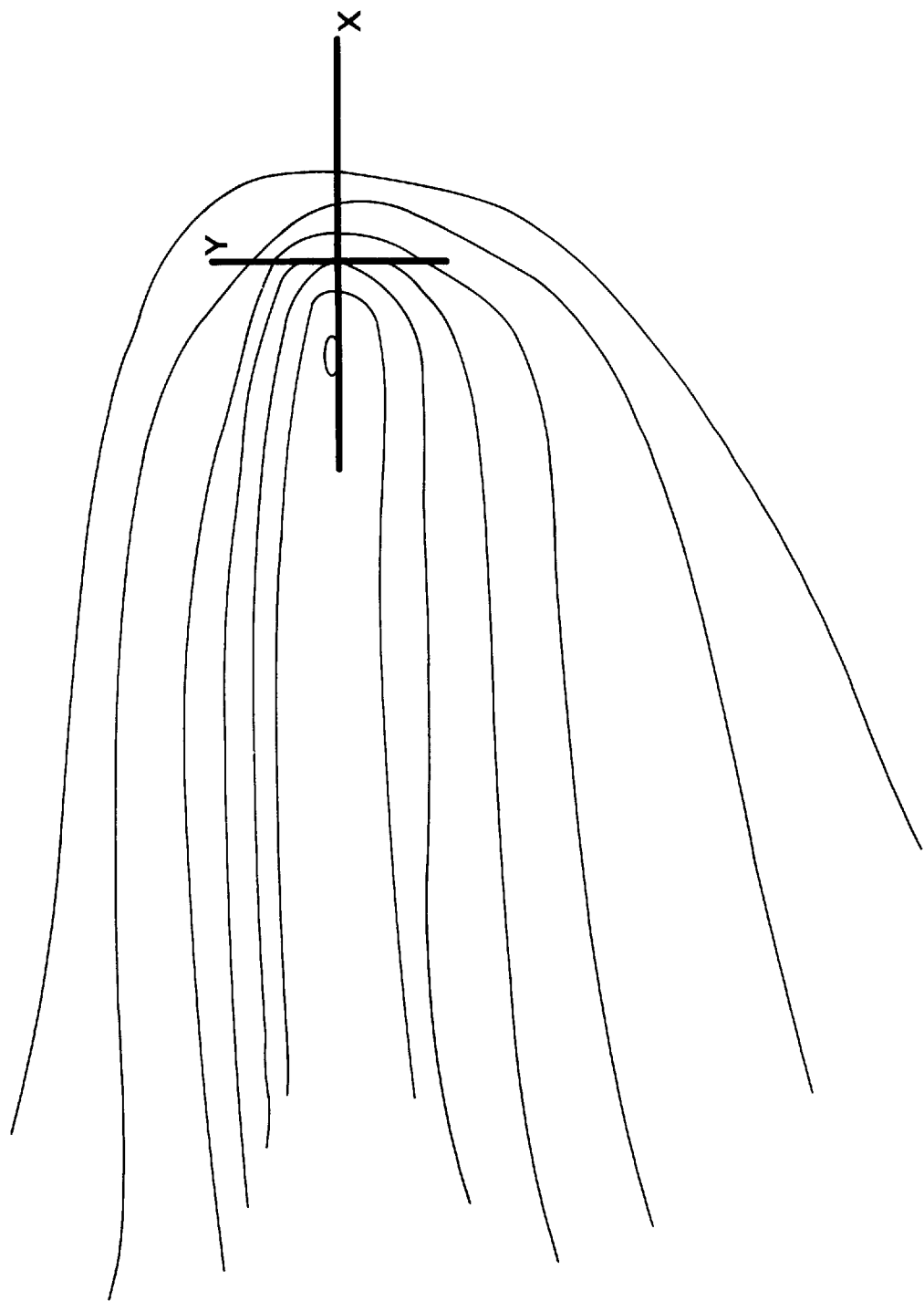
FIG. 3 illustrates one embodiment of a contour representation of a simulation result corresponding to an integrated circuit structure layout upon which curvature can be measured in a first manner.

FIG. 3 illustrates one embodiment of a contour representation of a simulation result corresponding to an integrated circuit structure layout upon which curvature can be measured in a first manner. In one embodiment, a two dimensional sampling pattern is used to determine slope of the model along the x-axis and curvature of the model along the y-axis. In an alternative embodiment, only curvature along the y-axis is measured. In another alternative embodiment, the angle between the line along which slope is determined and the line along which the curvature is determined are not perpendicular to each other.

While slope and curvature are discussed as being determined along one or more predetermined lines, the sampling points used in determining slope and/or curvature are not required to be linear. Representative integrated circuit structures are described herein with respect to x- and y-axes, which are traditionally horizontal and vertical axes, respectively; however, the slope and curvature samples can be taken along any orientation with respect to the integrated circuit structure.

In one embodiment, samples are taken at predetermined locations relative to the contour to determine slope along a first predetermined line (X) and curvature along a second predetermined line (Y). In one embodiment, slope is determined between adjacent sampling points along the first predetermined line; however, the sampling points used for determining slope are not all required to be on a common line. Similarly, in one embodiment, curvature is determined based the slope of a parabola fit to three sampling points on the second predetermined line; however, curvature can be determined in a different manner, for example, more than three points can be used, or curvature can be determined along a non-linear section.

Experience has shown use of curvature in determining the threshold value of an integrated circuit structure provides improved information compared to using slope alone, accordingly, the number of sampling points along the slope line (X) can be decreased to compensate for the increased number of sampling points used along the curvature line (Y). Therefore, little or no performance penalty is incurred for determining both slope and curvature as compared to determining slope only. In one embodiment, seven sampling points along the slope line are used to determine slope values and three sampling points along the curvature line are used to determine curvature; however, any number of points along either line can be used to determine slope and/or curvature.

In an embodiment where slope is determined along the first predetermined line and curvature is determined along the second predetermined line, the threshold for the corresponding structure can be determined according to:

$$I_{th} = f\left(I_{max}, \left.\frac{\partial I}{\partial x}\right|_{max}, \left.\frac{\partial^2 I}{\partial y^2}\right|_{x=fixed}\right)$$

where $$\left.\frac{\partial^2 I}{\partial y^2}\right|_{x=fixed}$$

represents the curvature of intensity representation of the integrated circuit structure along the y-axis. In other words, the second derivative of a parabola that is fit to three or more points along the y-axis can be used to predict of the curvature intensity representation of the integrated circuit structure. The curvature information provides a more accurate representation of the integrated circuit structure and therefore a more accurate determination of the integrated circuit structure threshold. The parabola can be fit to the curvature sampling points in any manner known in the art.

The sampling points along the x-axis used for determining the slope of the intensity representation of the integrated circuit structure define a first line segment. In one embodiment seven sampling points are used along the x-axis; however, any number of sampling points can be used. In one embodiment, the points used for determining curvature define a second line segment perpendicular to the first line segment; however, a perpendicular orientation is not required. Many different sets points can be used to estimate the curvature of the intensity representation of the integrated circuit structure. For example, the curvature can be determined at a midpoint of the first line segment, at either end of the first line segment, at the point of maximum intensity, at the point of maximum slope, or at any other point along the first line segment. A grid pattern of sampling points can also be used to determine slope and/or curvature of the intensity representation of the integrated circuit structure.

Other types of curvature can be used rather than fitting a parabola to a set of three or more points and determining the second derivative of the points along the parabola. For example, Gaussian curvature can be used, the radius of a circle fitted to the intensity representation of the structure can be used, other types of curvature and other geometric shapes can also be used to determine curvature.

In one embodiment, information gained from the slope and curvature can be used to make corrections to the layout used for manufacturing the integrated circuit structure such that the structure resulting from the manufacturing process more closely resembles the intended resulting structures than it would otherwise. In one embodiment, circuit layout structures are segmented. The various segments of the circuit layout are modified to facilitate closer realization of the intended structures.

Segmenting an integrated circuit layout involves inserting additional vertices to create smaller sections of edges, or edge fragments. Predefined rules generally define where vertices should be added. For example, vertices are usually added so that there is no more than a maximum edge segment length between vertices. Vertices can also be added near particular types of vertices, such as adding vertices near corner vertices so that a corner is comprised of two short edge fragments.

If more vertices are added, more precise edge placement corrections can be made, but more OPC computations are performed. That is, increasing the granularity of edge segments increases the potential OPC accuracy, but decreases speed. Densely filled areas are likely to need more intricate edge placement correction than sparsely filled areas, so more vertices may be added to densely filled areas than to sparsely filled areas.

In one embodiment, design layout segment placement is modified, if necessary, in response to the threshold determined based on the curvature of the contour representation of the integrated circuit structure. For example, a line end segment of a layout can be moved so that the threshold of the modeled integrated circuit structure corresponds more closely to the end of the design layout.

FIGS. 4A–4F illustrate exemplary sampling patterns suitable for use with the invention. FIG. 4A illustrates a sampling pattern where the curvature line segment is located at the midpoint of the slope line segment. FIG. 4B illustrates a sampling pattern where the curvature line segment is located at the endpoint of the slope line segment. FIG. 4C illustrates a sampling pattern where the curvature line segment is located at a point between the end point and the midpoint. FIG. 4D illustrates a grid sampling pattern. FIG. 4E illustrates a sampling pattern where the curvature line segment is located at the point of maximum intensity along the slope line segment. FIG. 4F illustrates a sampling pattern where the curvature line segment is located at the point of maximum slope along the slope line segment. Other sampling patterns can also be used.

Figure 5:
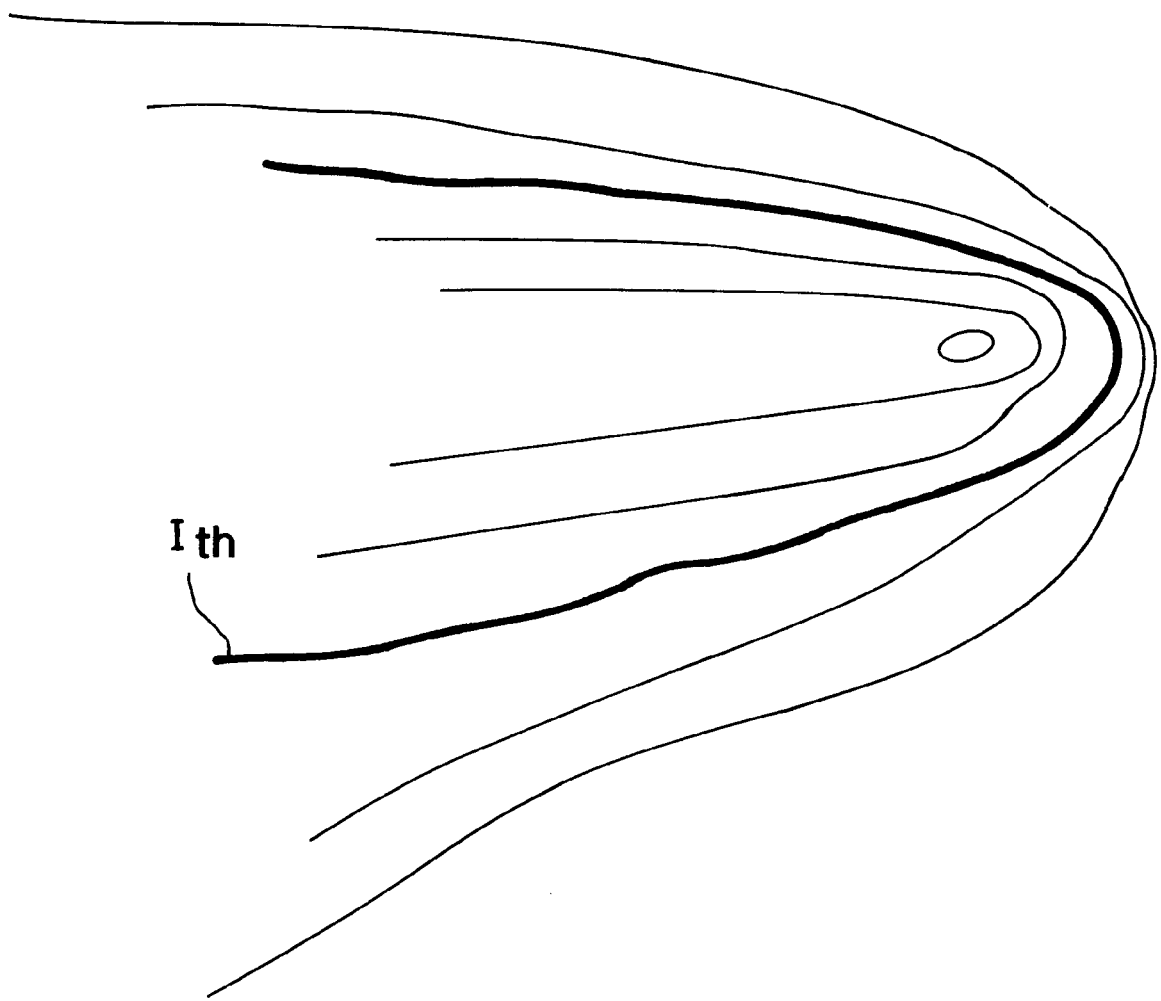
FIG. 5 illustrates one embodiment of a contour representation of a simulation result corresponding to an integrated circuit structure layout upon which curvature can be measured in a second manner.

FIG. 5 illustrates one embodiment of a contour representation of a simulation result corresponding to an integrated circuit structure layout upon which curvature can be measured in a second manner. In one embodiment, curvature is measured along a contour line, C. In such an embodiment, the intensity threshold can be measured as:

$$I_{th} = f\left(I_{max}, \left.\frac{\partial I}{\partial x}\right|_{max}, \left.\frac{\partial^2 x}{\partial y^2}\right|_{I=fixed}\right)$$

where $$\left.\frac{\partial^2 x}{\partial y^2}\right|_{I=fixed}$$

represents the curvature of the contour of the integrated circuit structure along a constant intensity contour. The curvature information can be used for OPC as described above.

Figure 6:
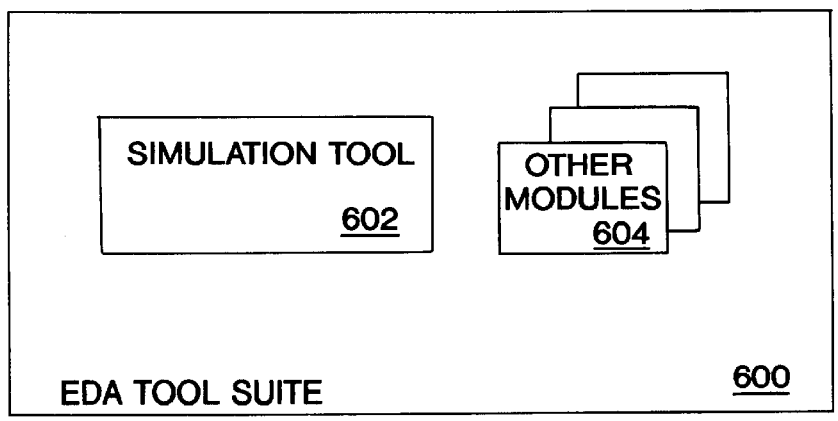
FIG. 6 illustrates an electronic design automation (EDA) tool that can be incorporated with the invention.

FIG. 6 illustrates an electronic design automation (EDA) tool that can be incorporated with the invention. As illustrated, EDA tool suite 600 includes simulation tool 602 incorporated with the teachings of the present invention as described earlier (e.g., VTR model 280 of FIG. 2). Additionally, EDA tool suite 600 includes other tool modules 604. Examples of these other tool modules 602 include but not limited to synthesis module, layout verification module and so forth.

Figure 7:
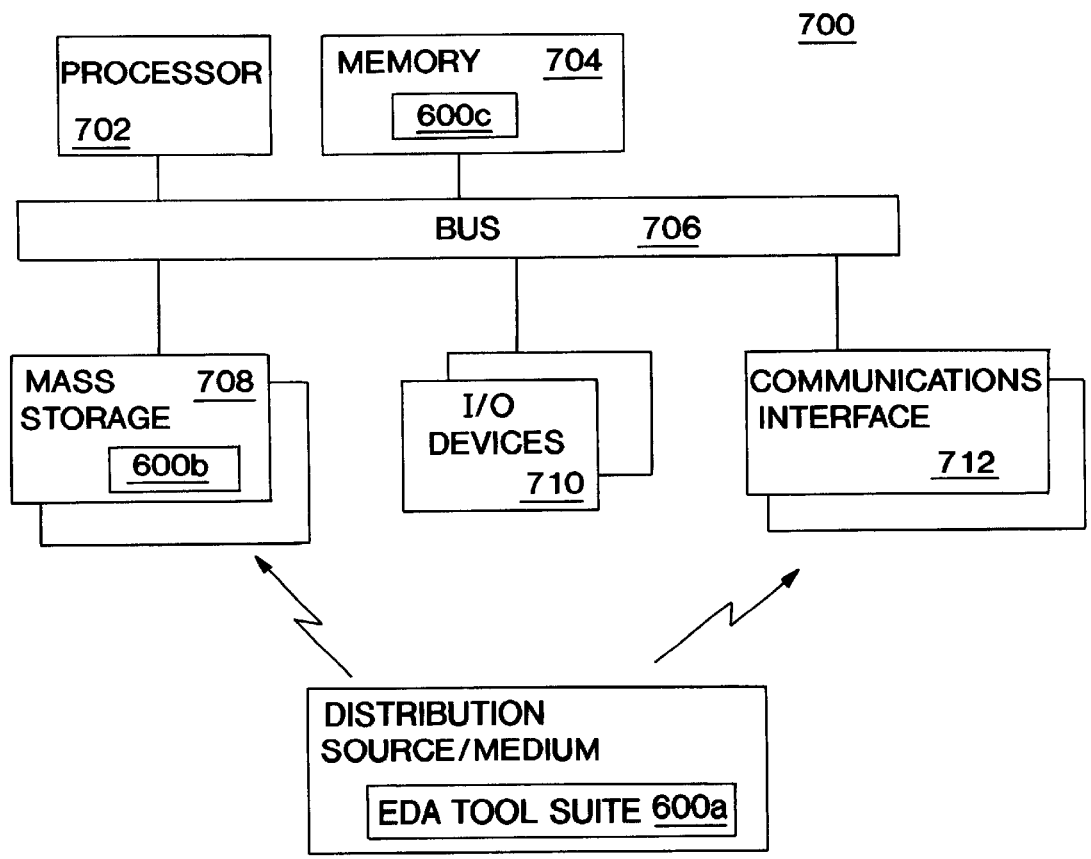
FIG. 7 illustrates one embodiment of a computer system suitable for use to practice the invention.

FIG. 7 illustrates one embodiment of a computer system suitable for use to practice the invention. As shown, computer system 700 includes processor 702 and memory 704 coupled to each other via system bus 706. Coupled to system bus 706 are non-volatile mass storage 708, such as hard disks, floppy disk, and so forth, input/output devices 710, such as keyboard, displays, and so forth, and communication interfaces 712, such as modem, LAN interfaces, and so forth. Each of these elements perform its conventional functions known in the art.

In particular, system memory 704 and non-volatile mass storage 708 are employed to store a working copy and a permanent copy of the programming instructions implementing the above described teachings of the present invention. System memory 704 and non-volatile mass storage 706 may also be employed to store the IC designs. The permanent copy of the programming instructions to practice the present invention may be loaded into non-volatile mass storage 708 in the factory, or in the field, using distribution source/medium 714 and optionally, communication interfaces 712. Examples of distribution medium 714 include recordable medium such as tapes, CDROM, DVD, and so forth. In one embodiment, the programming instructions are part of a collection of programming instructions implementing EDA tool 600 of FIG. 6. The constitution of elements 702–714 are well known, and accordingly will not be further described.

Figure 8:
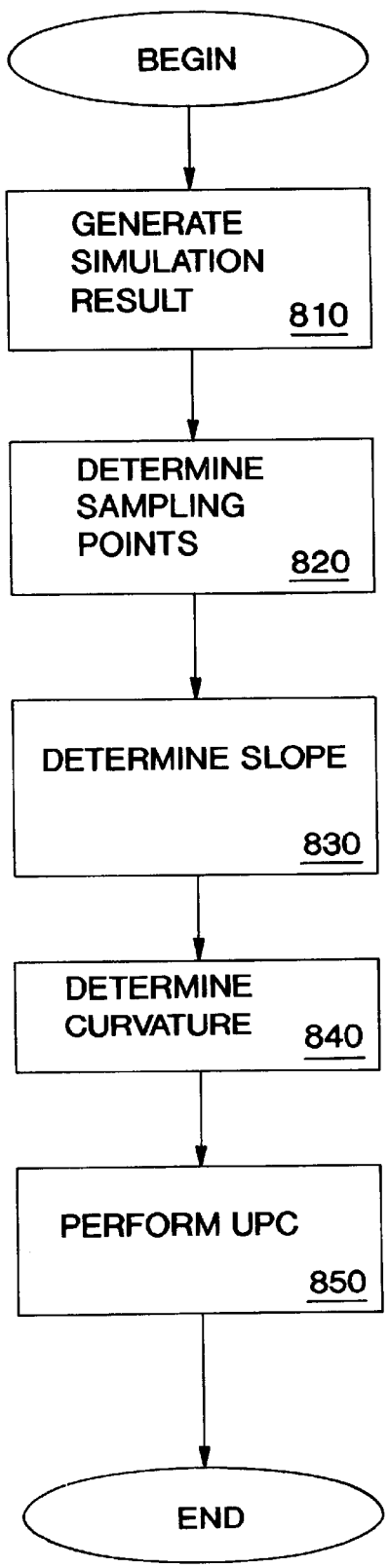
FIG. 8 a flow chart corresponding to one embodiment of OPC based on curvature.

FIG. 8 a flow chart corresponding to one embodiment of OPC based on curvature. In one embodiment the process of FIG. 8 is performed by an EDA tool based on an integrated circuit design layout. In an alternative embodiment, the process of FIG. 8 can be performed by a non-EDA application.

A simulation result such as an image of an integrated circuit structure layout is generated at 810. Generating the simulation result can be accomplished in any manner known in the art. Alternatively, a previously generated integrated circuit intensity pattern can be used instead.

Sampling points are determined at 820. In one embodiment, a set of sampling points (e.g., FIGS. 4A–4F) are applied to the contour of each design layout segment. In other words, samples are taken according to the chosen sampling pattern for the contour of each segment. In one embodiment, the x-axis sampling points described above are perpendicular to the contour of the design layout segment and the y-axis sampling points are parallel to or coincident with the contour of the layout segment. In alternative embodiments, sampling points are not necessarily orthogonal as described above, for example, the x-axis can be at an angle of 45° with respect to the contour of the layout segment.

Slope is determined at 830. In one embodiment, both the point of maximum intensity and the steepest slope (i.e., the pair of sampling points on the contour representation having the greatest slope therebetween) are determined. Curvature is determined at 840. Curvature can be determined according to any manner described above.

OPC is performed at 850. In one embodiment, layout for line segments can be modified to compensate for optical effects (e.g., line end shortening) that result in an integrated circuit structure closer to the designed integrated structure using the determined slope and curvature. The process of FIG. 8 can be repeated for the modified integrated circuit layout to improve results further.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A method of performing optical and process correction (OPC) on a semiconductor layout to be created on a wafer, comprising:

receiving a layout;

fragmenting the layout into a number of segments;

performing an aerial image simulation of a mask/reticle having the segments, the simulation result including contours of light intensity corresponding to each segment;

defining a first number of sampling points perpendicular to a light intensity contour and determining a slope of light intensity between the first sampling points;

defining a second number of sampling points along a light intensity contour and determining a curvature of the contour at the second sampling points;

selecting a variable threshold as a function of the intensity, slope and curvature data determined; and using the variable threshold selected in performing OPC on the segments of the mask/reticle.

2. The method of claim 1, wherein the first sampling points at which the slopes are determined are in a line and wherein the position of the second sampling points for curvature are at the end of that line.

3. The method of claim 1, wherein the first sampling points at which the slopes are determined are in a line and wherein the position of the second sampling points for curvature are at a point between the ends of that line.

4. The method of claim 1, wherein the second sampling points for curvature are positioned at a point having a maximum slope.

5. The method of claim 1, wherein the curvature is determined by selecting three or more sampling points along the contour and fitting a parabola to the three or more sampling points.

6. A computer readable medium having a sequence of instructions stored thereon that when executed, cause a computer to perform the method of any of claims 1–5.

* * * * *